(12) United States Patent
Choi

(10) Patent No.: US 6,765,439 B2
(45) Date of Patent: Jul. 20, 2004

(54) IMPEDANCE MATCHING FOR A POWER AMPLIFIER SYSTEM

(75) Inventor: Kevin Choi, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/661,749

(22) Filed: Sep. 12, 2003

(65) Prior Publication Data

US 2004/0051584 A1 Mar. 18, 2004

Related U.S. Application Data

(63) Continuation-in-part of application No. 09/818,285, filed on Mar. 27, 2001, now Pat. No. 6,639,465.

(51) Int. Cl.[7] .................................................. H03G 3/20
(52) U.S. Cl. ................ 330/129; 330/124 D; 330/124 R
(58) Field of Search ...................... 330/129, 51, 124 D, 330/124 R, 295

(56) References Cited

U.S. PATENT DOCUMENTS

| | | | |
|---|---|---|---|
| 4,873,493 A | 10/1989 | Fujiwara | 330/285 |
| 5,661,434 A | 8/1997 | Brozovich et al. | 330/51 |
| 5,872,481 A | 2/1999 | Sevic et al. | 330/51 |
| 5,923,215 A | 7/1999 | Hans | 330/149 |
| 5,955,921 A | 9/1999 | Ide et al. | 330/254 |
| 6,285,239 B1 | 9/2001 | Iyer et al. | 327/531 |
| 6,288,608 B1 * | 9/2001 | Jadus et al. | 330/124 R |
| 6,515,541 B2 * | 2/2003 | Cheng et al. | 330/51 |

* cited by examiner

Primary Examiner—Henry Choe
(74) Attorney, Agent, or Firm—Thomas, Kayden, Horstemeyer & Risley, LLP

(57) ABSTRACT

One embodiment is a method for adjusting impedance of a power amplifier system comprising combining an output of a first power amplifier with an output of a second power amplifier via a coupler that couples an output connection of the first power amplifier with an output connection of the second power amplifier, wherein a prematching impedance network coupled to the second power amplifier adjusts a system impedance to a first value when the second power amplifier is not actuated, and wherein the prematching impedance network adjusts the system impedance to a second value when the second power amplifier is actuated.

16 Claims, 11 Drawing Sheets

IMPEDANCE MATCHING FOR A POWER AMPLIFIER SYSTEM

CROSS-REFERENCE TO RELATED APPLICATION

This application is a continuation-in-part of copending U.S. utility application entitled, "DYNAMIC BIAS FOR A POWER AMPLIFIER," having Ser. No. 09/818,285, filed Mar. 27, 2001, now issued as U.S. Pat. No. 6,639,465 B2, granted on Oct. 28, 2003, which is entirely incorporated herein by reference.

BACKGROUND OF THE INVENTION

1. Technical Field

The invention is generally related to power amplifiers and, more particularly, is related to adjusting impedance of a power amplifier system.

2. Related Art

With the increasing power efficiency demands from users of mobile communication devices, such as cell phones and the like, mobile communication device manufacturers are continually searching for ways to improve power consumption efficiency within the mobile communication device, thereby increasing the useful operating period that a mobile communication device gets from a single charge of the power source, such as, but not limited to, a battery or fuel cell. During a normal voice conversation by a person using the mobile communication device, the transmitting function consumes a very large amount of available power. As such, energy conservation in transmitters is of paramount importance.

Conventional mobile communication devices typically consume large amounts of power as a voice signal is converted into a communication signal and amplified to a power level necessary for transmission from the mobile communication device to a base station. Within the communication industry, significant efforts continue to attempt to minimize power consumption. Therefore, there is an ongoing need to continue to reduce energy consumption in mobile communication devices.

SUMMARY

The invention provides for adjusting impedance of a power amplifier system. One embodiment is a method for adjusting impedance of a power amplifier system comprising combining an output of a first power amplifier with an output of a second power amplifier via a coupler that couples an output connection of the first power amplifier with an output connection of the second power amplifier, wherein a prematching impedance network coupled to the second power amplifier adjusts a system impedance to a first value when the second power amplifier is not actuated, and wherein the prematching impedance network adjusts the system impedance to a second value when the second power amplifier is actuated.

In another embodiment, a system that adjusts impedance of a power amplifier system comprises a first power amplifier amplifying a communication signal; a bias controller for outputting a control signal, the bias controller coupled to a node in a communication device such that the communication signal is sensed; a second power amplifier responsive to the control signal, such that the bias controller activates the second power amplifier when an amplitude of the communication signal is at least equal to a predetermined amplitude, and such that the bias controller deactivates the second power amplifier when the amplitude of the communication signal is less than the predetermined amplitude; and a prematching impedance network coupled to at least the second power amplifier such that when the bias controller activates the second power amplifier the prematching impedance network adjusts a system impedance to a first value when the first power amplifier is activated, and such that when the bias controller deactivates the second power amplifier the prematching impedance network adjusts the system impedance to a second value when the first power amplifier and the second power amplifier are activated.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
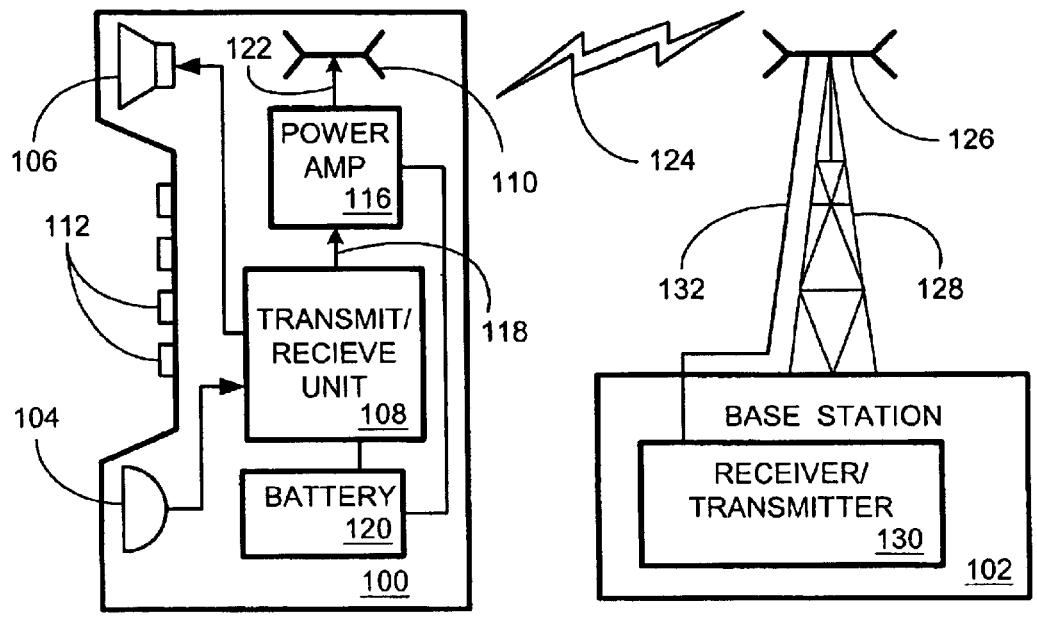
FIG. 1 is a simplified block diagram of a mobile communication device communicating with a base station.

FIG. 1 is a simplified block diagram of a mobile communication device 100 communicating with a base station 102. Mobile communication device 100 typically has a microphone 104, a speaker 106, a transmit/receive unit 108 and an antenna 110. To initiate a voice conversation, a user actuates keys 112 on a keypad to transmit a destination code, such as a telephone number, to the transmit/receive unit 108. The user's voice is transformed into a communication signal by the transmit/receive unit 108 and transmitted to power amplifier 116 via connection 118. Power amplifier 116, using energy from power source 120, amplifies the communication signal and injects the communication signal onto antenna 110 via connection 122. The amplified communication signal 124 is then transmitted to base station antenna 126, typically set up on a tower 128 or other similarly situated high point. Non-limiting examples of power source 120 include conventional batteries, fuel cells and solar energy panels. The received communication signal 126 then travels to the base station receiver/transmitter 130 via connection 132. Once the base station 102 has established connectivity to the destination location (not shown), as defined by the telephone number, a person using mobile communication device 100 carries on a voice telephone conversation with another person at the destination location.

Figure 2:
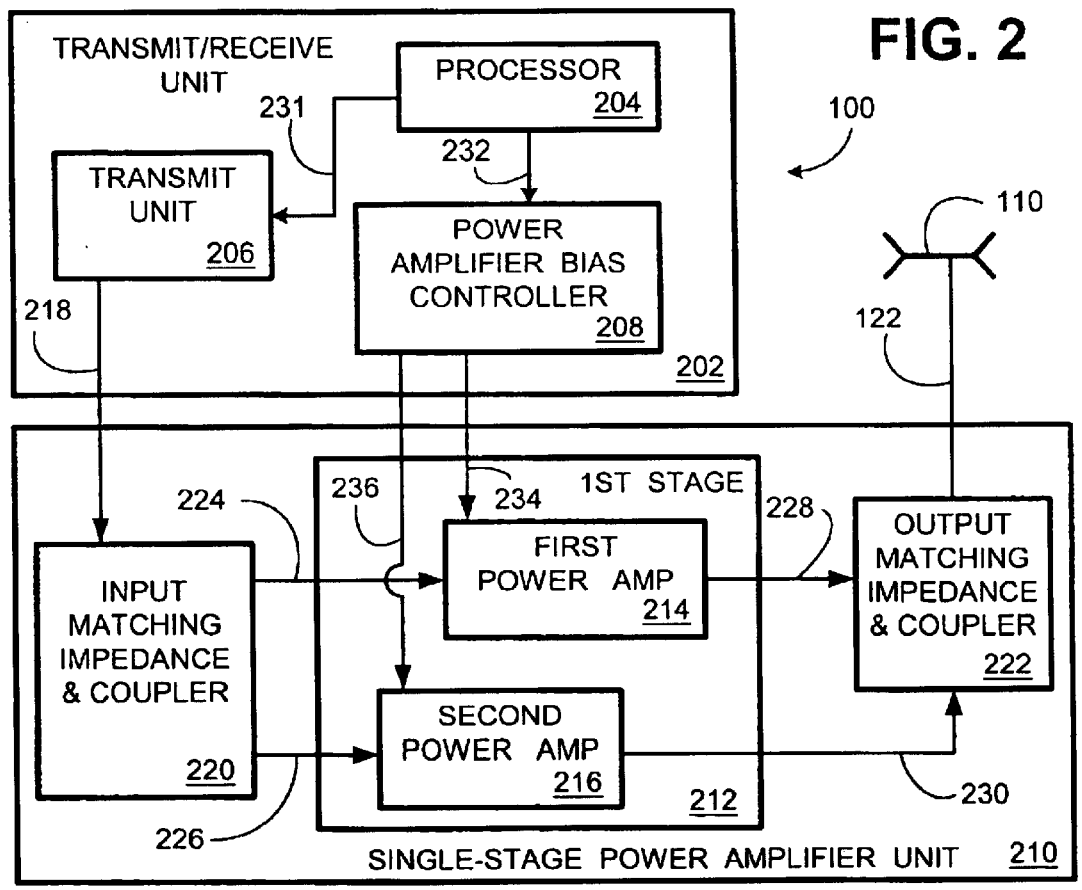
FIG. 2 is a block diagram illustrating selected transmitter components of the mobile communication device of FIG. 1.

FIG. 2 is a block diagram illustrating additional selected transmitter components of the mobile communication device 100. The transmit/receive unit 202, in this simplified illustrative example, has at least a processor 204, a transmit unit 206 and a power amplifier bias controller 208. Single-stage power amplifier unit 210 employs first stage 212 having two power amplifiers 214 and 216 that amplifies communication signals received from transmit unit 206 via connection 218 (see also FIG. 1). The transmit/receive unit 202 and the power amplifier 210 are well known components of a conventional mobile communication device 100. Detailed operation of the individual components are not described in detail other than to the extent necessary to understand the operation and functioning of these components with respect to the invention. One skilled in the art will realize that the mobile communication device 100 or other similar mobile communicators may have the components shown in FIG. 2 connected in a different order and manner than shown in FIG. 2, or may not include all of the components shown in FIG. 2, or may include additional components connected in some manner with the components shown in FIG. 2. Any such variations in a mobile communication device 100 or a similar mobile communication device are intended to be within the scope of this disclosure.

The single-stage power amplifier unit 210 as shown in FIG. 2 is a simplified illustration of a power amplifier. In one embodiment, power amplifier 210 employs a first power amplifier 214 and a second power amplifier 216. An input matching impedance and coupler 220 is disposed between the input to the power amplifier 210 (at connection 218) and the power amplifiers 214 and 216. An output matching impedance and coupler 222 is disposed between the power amplifiers 214 and 216. A communication signal is received by power amplifier 210 from the transmit unit 206 via connection 218. The communication signal travels through the input matching impedance and coupler 220 to the power amplifiers 214 and 216 via connections 224 and 226, respectively. After amplification by the power amplifiers 214 and 216, the communication signal is transmitted to the output matching impedance and coupler 222, via connections 228 and 230, respectively. The amplified communication signal is transmitted from the output matching impedance and coupler 222, via connection 122, to antenna 110. Typically, there may be other components between antenna 110 and output matching impedance 222, but such components are not described here for convenience and because such components are not relevant to the explanation of the operation and functionality of the single-stage power amplifier unit 210 and its components. The degree of amplification of the communication signal by the first power amplifier 214 and the second power amplifier 216 is determined by processor 204 and controlled by the power amplifier bias controller 208 residing in the transmit/receive unit 202.

Processor 204 communicates with the transmit unit 206, via connection 231, to specify various parameters associated with the converted output communication signal. For example, the processor 204 may specify the transmission frequencies to be used by the transmit unit 206 when a voice signal is converted to a communication signal suitable for transmission. Processor 204 also controls the amplification levels of the power amplifiers 214 and 216 by providing instructions to the power amplifier bias controller 208, via connection 232. The power amplifier bias controller 208 controls the bias of the first power amplifier 214, via connection 234, thereby controlling the amount of signal amplification by the first power amplifier 214.

For illustrative purposes, FIG. 2 shows the bias of the second power amplifier 216 controlled by power amplifier bias controller 208, via connection 236. This configuration corresponds to a typical conventional system in that the power amplifier bias controller 208 controls the amount of signal amplification by the second power amplifier 216.

Figure 3:
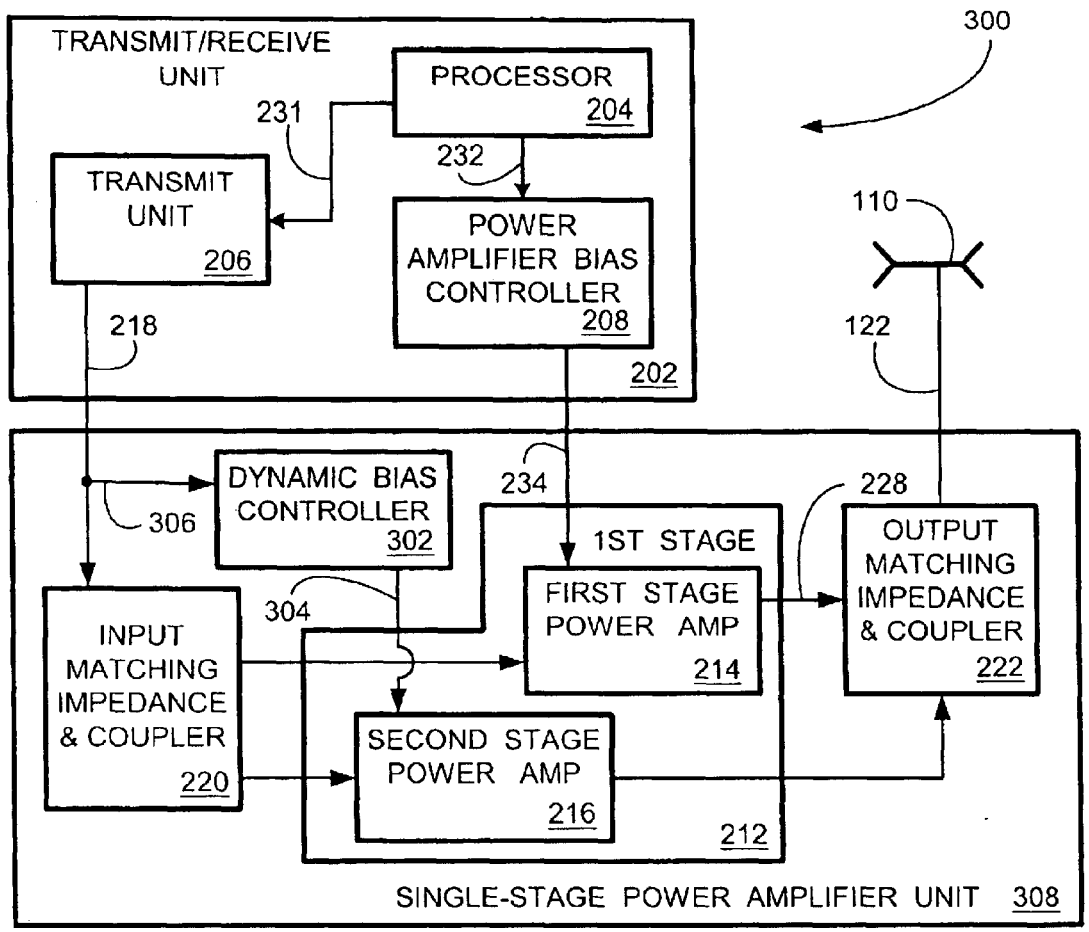
FIG. 3 is a block diagram of the dynamic bias controller residing in the mobile communication device of FIG. 1.

FIG. 3 is a block diagram of the dynamic bias controller 302 residing in the mobile communication device 300. The dynamic bias controller 302 controls the bias applied to the second stage power amplifier 216, via connection 304. The dynamic bias controller 302 detects the RF signal on connection 218, via connection 306, and activates the second stage power amplifier 216 when the amplitude of the RF signal is such that both the first stage power amplifier 214 and the second stage power amplifier 216 are to be used by the single-stage power amplifier unit 308 to generate the amplified communication signal. Alternatively, dynamic bias controller 302 may detect the RF signal on any other suitable connection (not shown) having a signal having a voltage that is spectrally related to the signal on connection 218.

Figure 4:
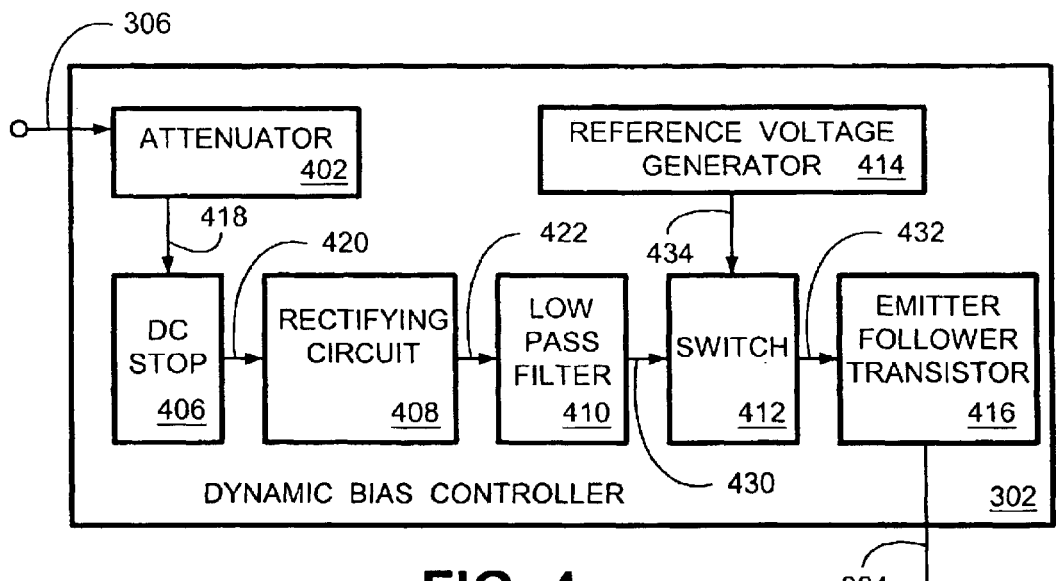
FIG. 4 is a block diagram showing components residing in an embodiment of the dynamic bias controller of FIG. 3.

FIG. 4 is a block diagram showing components residing in an embodiment of the dynamic bias controller 302. These components include at least attenuator 402, DC stop 406, rectifying circuit 408, low pass filter 410, switch 412, reference voltage generator 414 and emitter follower transistor 416. Dynamic bias controller 302, via connection 306, detects the communication signal. Attenuator 402 attenuates the detected communication signal such that portions of the communication signal that exceed a predefined threshold are output by attenuator 402, via connection 418. Thus, any portion of the communication signal that is output over connection 418 corresponds to an operating condition where the second stage power amplifier 216 (FIG. 3) should be amplifying the communication signal. Attenuator 402 may be implemented using well known components commonly employed in attenuator and thresholding systems. Thus, a detailed description of the individual components residing in attenuator 402 is not provided since such a description is not necessary to understand the operation and functioning of the dynamic bias controller 302. One skilled in the art will realize that attenuator 402 may be implemented by a variety of means such that portions of the communication signal that have an amplitude that exceed the predefined threshold is output by the attenuator 402. Any such embodiments of attenuator 402 utilized in a dynamic bias controller 302 are intended to be within the scope of this disclosure and to be protected by the accompanying claims.

The output of attenuator 402 is coupled to the DC stop 406 via connection 418. DC stop 406 prevents any direct current (DC) generated within the dynamic bias controller 302 from flowing out of the dynamic bias controller 302 via connection 306. Such DC currents, if allowed to flow out of the dynamic bias controller 302 over connection 306, might undesirably interfere with the communication signal being detected by the single-stage power amplifier unit 308 (FIG. 3). Since DC stop 406 may be implemented using well known components, such as a capacitor or any other device that is designed to stop the flow of DC current, a detailed description of the individual components residing in DC stop 406 is not provided. All such embodiments of DC stop 406 utilized in a dynamic bias controller 302 are intended to be within the scope of this disclosure and to be protected by the accompanying claims.

Rectifying circuit 408 detects portions of the communication signal that exceeds the predefined threshold. Rectifying circuit 408 rectifies the portions of the communication signal received, and outputs the rectified portions of the communication signal to low pass filter 410, via connection 422. Low pass filter 410 filters out any fundamental and harmonic frequency components, such as, but not limited to, alternating current (AC) components, of the detected portions of the communication signal received over connection 422 and outputs the base band portion of the communication signals to switch 412, via connection 430. Switch 412, via connection 432, controls emitter follower 416. If base band portions of the communication signal that exceed the predefined threshold are output by low pass filter 410 onto connection 430, switch 412 activates emitter follower transistor 416, in a manner described below, such that the second stage power amplifier 216 (FIG. 3) is conducting. If low pass filter 410 does not output any base band signal over connection 430 (the amplitude of the detected communication signal on connection 306 is below the threshold of attenuator 402), then switch 412 deactivates emitter follower transistor 416 such that the second stage power amplifier 216 is not conducting. Reference voltage generator 414, via connection 434 provides an appropriate predefined voltage reference such that switch 412 can control emitter follower transistor 416.

Figure 5:
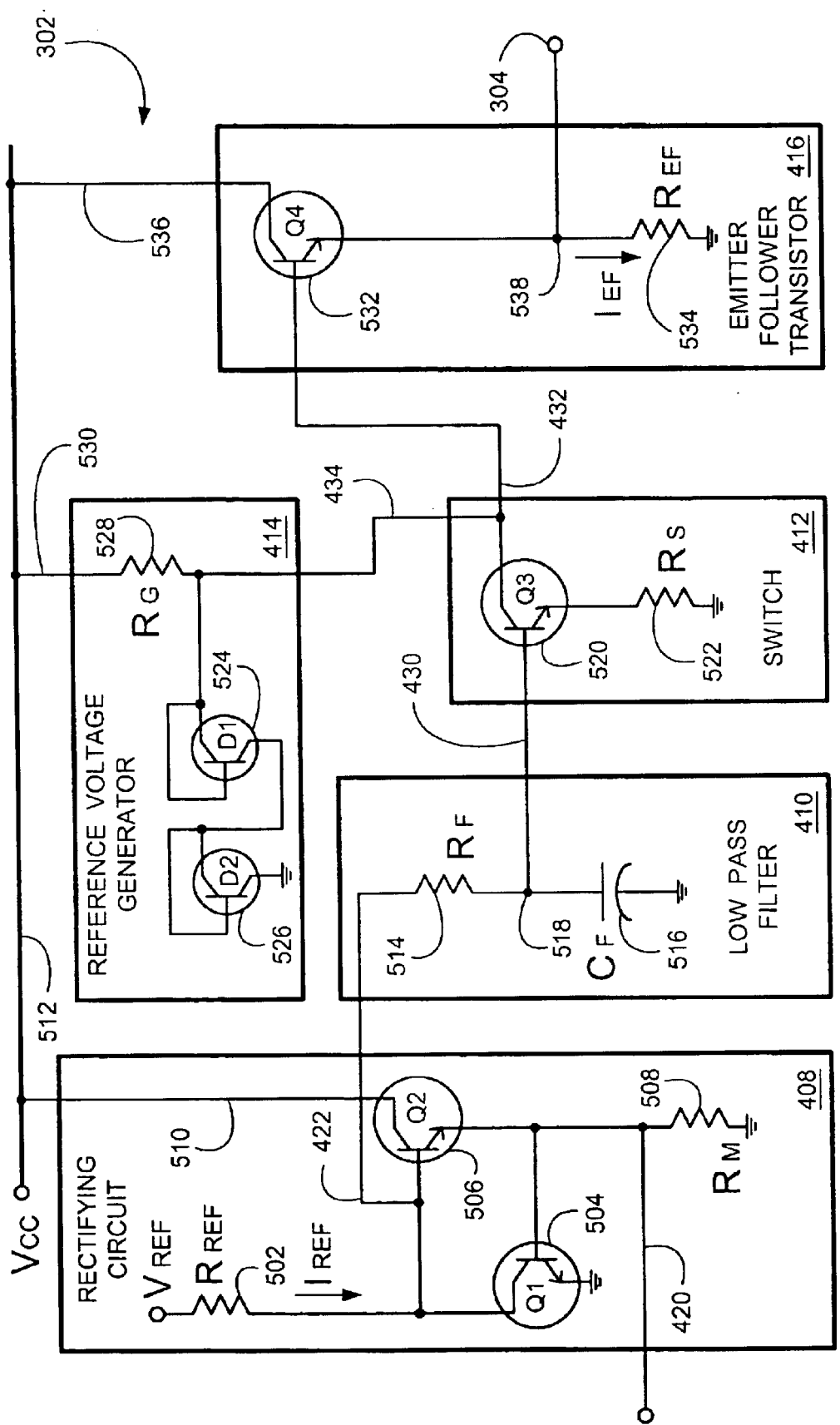
FIG. 5 is a block diagram showing selected components of an exemplary embodiment of the dynamic bias controller of FIG. 4.

FIG. 5 is a block diagram showing selected components of an exemplary embodiment of the dynamic bias controller 302 (FIGS. 3 and 4). One skilled in the art will appreciate that the illustrated components as shown in FIG. 5 may have the elements connected in a different order and manner than shown in FIG. 5, or may not include all of the elements shown in the components of FIG. 5, or may include additional elements within the components connected in some alternative manner. Any such variations in the elements of the components residing in a dynamic bias controller 302 that have the same operation and functionality of the illustrative components shown in FIG. 5 are intended to be within the scope of this disclosure and to be protected by the accompanying claims.

Rectifying circuit 408 of FIG. 5 includes a reference resistor (RREF) 502, a first transistor (Q1) 504, a second transistor (Q2) 506 and a resistor connected to ground (RM) 508. RREF 502 is shown coupled to a reference voltage (VREF) such that a reference current (IREF) is provided to transistors Q1 504 and Q2 506 as shown. Transistor Q2 506 is coupled to Vcc, via connection 510, as illustrated. For convenience of illustration, Vcc is shown to be available from a bus 512 that is easily accessible by other components of the dynamic bias controller 302 and other components (not shown) residing in the mobile communication device 300 (FIG. 3). As portions of the communication signal that have a magnitude exceeding the predefined threshold are received by the rectifying circuit 408 on connection 418, are rectified and then passed to the low pass filter 410 over connection 422.

Low pass filter 410 includes a filtering resistor (RF) 514 and a filtering capacitor (CF) 516. The rectified portions of the communication signal exceeding the threshold are attenuated by RF 514. Then, at node 518, the AC components of the portions of the RF signals are filtered by CF 516. After filtering by low pass filter 410, a signal is delivered to switch 412 via connection 430. The signal on connection 430 includes those portions of the communication signal having an amplitude that exceeds the predefined threshold, as defined by attenuator 402 (FIG. 4), that have been rectified by the rectifying circuit 408 and that have had the AC components filtered by low pass filter 410.

Switch 412 includes a switching transistor (Q3) 520 and a switch resistor (RS) 522 connected to ground. If any signal is provided to switch 412 over connection 430, as described above, Q3 is activated. If there is no signal on connection 430 (i.e., the amplitude of the communication signal is less than the threshold as determined by attenuator 402) then Q3 is deactivated.

Reference voltage generator 414 includes a first diode (D1) 524, a second diode (D2) 526 and a resistor (RG) 528. Reference voltage generator 414 is coupled to a voltage source (Vcc) on bus 512 via connection 530, and is coupled to switch 412 via connection 534. When Q3 520 is conducting, the voltage on connection 432 is small and insufficient to activate Q4 532. When Q3 520 is not conducting, voltage on connection 432 is equal to the voltage generated by voltage generator 414 and is sufficient to activate Q4 532. Diodes D1 and D2 may be any suitable conventional diode or a specially fabricated diode.

Emitter follower transistor 416 includes a transistor (Q4) 532 and a resistor (REF) 534. Q4 is connected to the voltage source Vcc at bus 512 via connection 536 as shown. When the voltage on connection 432 is substantially zero, Q4 is activated (not conducting) and the voltage at node 538 is zero. When the voltage on connection 432 is equal to the voltage provided by reference voltage generator 414 (Q3 520 is not conducting) then Q4 532 is activated (conducting). When Q4 is activated, current flows from bus 512 through Q4 532 and through REF 534 to ground. Thus, the voltage at node 538 is now equal to (IEF×REF). This non-zero voltage at node 538 is output from the emitter follower transistor 416 via connection 304. As described above, when the voltage on connection 304 is above the turn-on voltage, the second stage power amplifier 216 (FIG. 3) is activated such that the communication signal is amplified by the second stage power amplifier 216. One skilled in the art will appreciate that the transistor Q4 532 and the resistor REF 534 can be sized so that a desired voltage is provided on connection 304 and so that the second stage power amplifier 216 is activated.

In summary, the dynamic bias controller 302 (FIGS. 3 and 4) senses the amplitude of a communication signal and automatically determines when the second stage power amplifier 216 residing in the single-stage amplifier 212 is to be activated, thereby amplifying the communication signal that is to be transmitted from the mobile communication device 300 (FIG. 3). The dynamic bias controller 302 accomplishes this function by detecting those portions of the communication signal that have an amplitude greater than a predefined threshold value, as determined by attenuator 402 (FIG. 4), and by generating a voltage on connection 304 that activates the second stage power amplifier 216.

Figure 6:
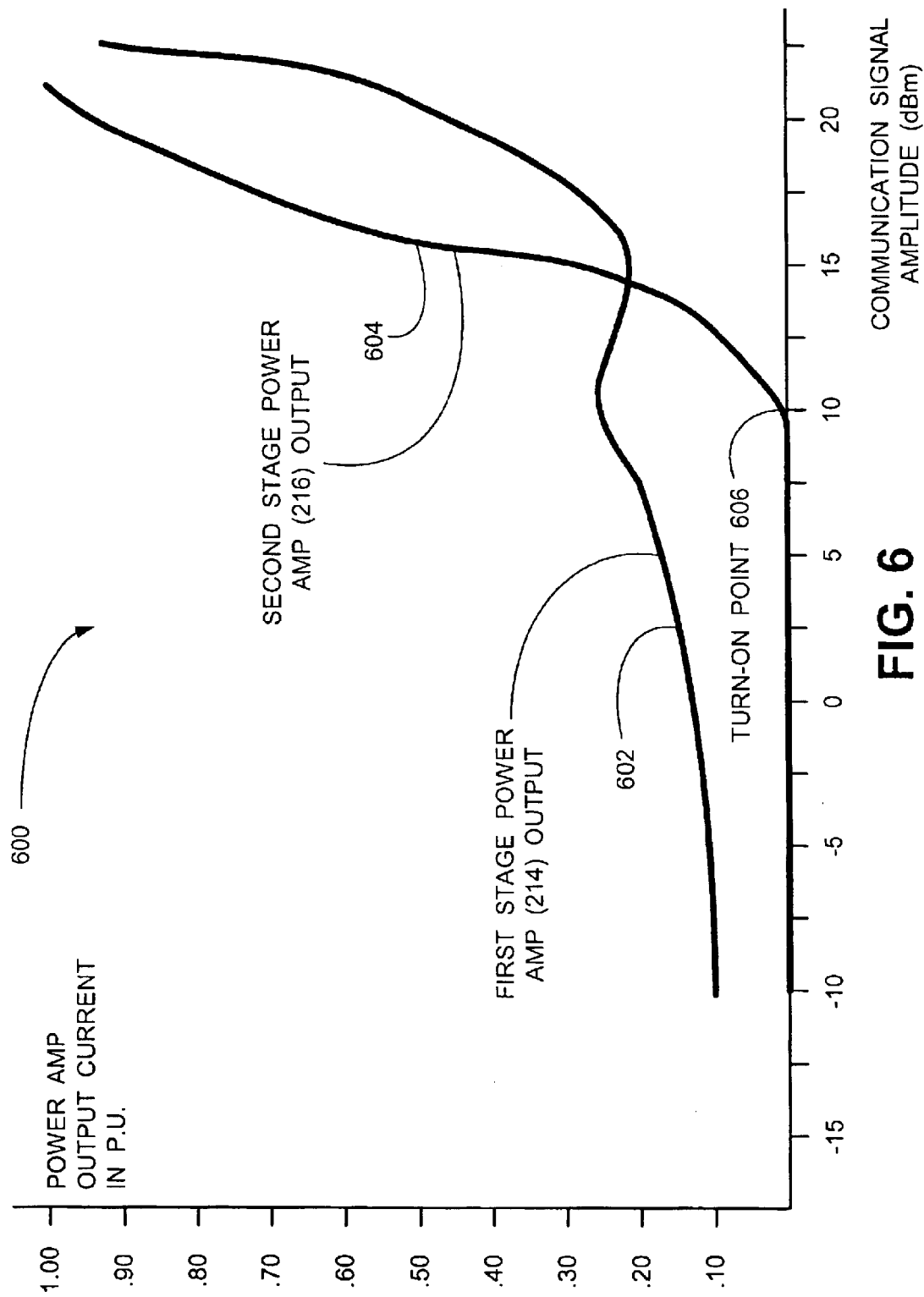
FIG. 6 is a graph of the output power of the power amplifiers of FIG. 3 when controlled by the dynamic bias controller of FIGS. 3 and 4.

FIG. 6 is a graph of the output power of the power amplifiers 214 and 216 (FIG. 3) when controlled by the dynamic bias controller 302 (FIGS. 3 and 4). The vertical axis of graph 600 is the output bias current, in per unit (p.u.), of the first stage power amp 214 and the second stage power amp 216 (FIG. 3). The horizontal axis of graph 600 is the amplitude, in milli-decibels (dBm), of the detected communication signal on connection 306 (FIGS. 3 and 4). The output of amplifiers 214 and 216, as shown on graph 600, are intended to be illustrative hypothetical outputs of the amplifiers 214 and 216 to facilitate an explanation of the operation and functionality of the dynamic bias controller 302 in response to a detected hypothetical communication signal. Thus, one skilled in the art will appreciate that the output of the two amplifiers in practice can be specified, designed and/or implemented in mobile communication device 300 (FIG. 3) in a manner that provides any desired output level from the two power amplifiers 214 and 216.

Curve 602 represents an example of the output of the first stage power amp 214. Curve 604 represents the power output of the second stage power amp 216. When the communication signal amplitude detected on connection 306 is between −10 dBm and 10 dBm, the output of the second stage power amp 216 is zero p.u. That is, the dynamic bias controller 302 has deactivated the second stage power amp 216 when the amplitude of the communication signal is between −10 dBm and 10 dBm. When the communication signal amplitude is between −10 dBm and 10 dBm, only the first stage power amp 214 is required to be activated to provide an adequate amplified communication signal to the antenna 110 (FIG. 1). Since second stage power amp 216 is deactivated, power is conserved.

When the amplitude of the communication signal reaches 10 dBm, the turn-on point 606 of the second stage power amp 216 is reached and the second stage power amp 216 activates. The output of the second stage power amp 216 increases in a manner that corresponds to the increasing amplitude of the communication signal such that an amplified communication signal of adequate strength for broadcasting is delivered to antenna 110. In the simplified illustrative example of FIG. 6, the turn-on point 606 is selected to be at a communication signal amplitude equal to 10 dBm. This 10 dBm turn-on point 606 was effected by the threshold point as defined by the attenuator 402 (FIG. 4). When the amplitude of the communication signal exceeds 10 dBm, a portion of the communication signal is processed by the dynamic bias controller 302 such that the output of the dynamic bias controller 302 on connection 304 activates the second stage power amp 216.

The 10 dBm turn-on point 606 illustrated in the graph 600 of FIG. 6 was selected as a convenience for explaining the operation and functionality of a dynamic bias controller 302 implemented in a mobile communication device 300 (FIG. 3). The turn-on point 606 could be designed to be at any value of the communication signal amplitude depending upon the particular needs of the mobile communication device 300. The turn-on point 606 can be specified by the appropriate determination of the various components of the dynamic bias controller 302. For example, the threshold of attenuator 402 could be modified. Alternatively, VREF in the rectifying circuit 408 (FIG. 5) and/or the reference resistor RREF 502 could be selected such that the turn-on point 606 could be adjusted to a different value.

Additionally, the turn-on voltage of transistor Q3 520 residing in switch 412 could be specified such that the turn-on point 606 could be adjusted. One skilled in the art will appreciate that other components residing in the dynamic bias controller 302 might be defined in a similar manner to adjust the turn-on point 606. Any such variations in the components residing in the dynamic bias controller 302, and/or any variations in the elements residing in those components, are intended to be within the scope of this disclosure and to be protected by the accompanying claims.

Figure 7:
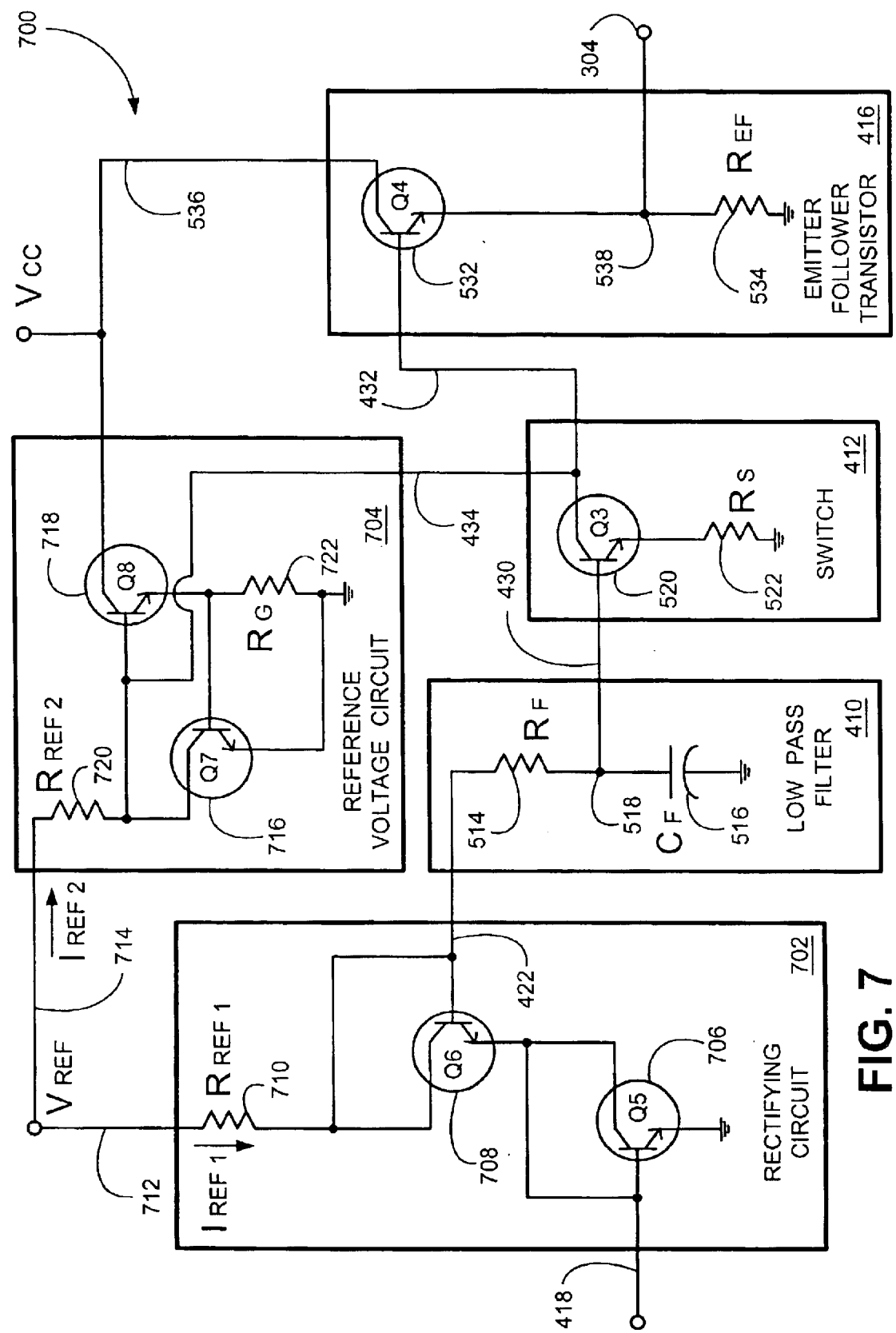
FIG. 7 is a block diagram of an embodiment of the dynamic bias controller having alternative configurations of the rectifying circuit and reference voltage generator.

FIG. 7 is a block diagram of an embodiment of the dynamic bias controller 700 having an alternative configuration of the rectifying circuit 702 and reference voltage circuit 704. Generally, when compared to the configuration of the components residing in the dynamic bias controller 302 of FIG. 5, the components of the dynamic bias controller 700 are generally similar. Low pass filter 410, switch 412 and emitter follower transistor 416, are substantially the same as in the embodiment as shown in FIG. 5. Furthermore, the individual components are coupled together in substantially the same manner. That is, rectifying circuit 702 is coupled to the low pass filter 410 via connection 422. Low pass filter 410 is coupled to switch 412 via connection 430. Switch 412 is coupled to emitter follower transistor 416 via connection 432. The emitter follower is coupled to the voltage source Vcc via connection 536 and the output of the emitter follower transistor 416 is output at connection 304.

Rectifying circuit 702 employs different elements as compared to the rectifying circuit 408 in FIG. 5. Here, a rectifying circuit 702 employs a first transistor (Q5) 706, a second transistor (Q6) 708 and a reference resistor (RREF1) 710. RREF1 is coupled to a reference voltage VREF via connection 712. Reference voltage circuit 704 is also coupled to the same VREF via connection 714. Reference voltage circuit 704 includes a transistor (Q7) 716, a transistor (Q8) 718, a reference resistor (RREF2) 720 and a resistor (RG) 722 connected to ground. Here, RREF1 710 and RREF2 720 have been selected such that corresponding reference currents, IREF1 and IREF2 are provided to the rectifying circuit 702 and the reference voltage circuit 704, respectively. The dynamic bias controller 700 operates in substantially the same manner as explained above for the dynamic bias controller 302 illustrated in FIG. 5. Here, an attenuator (not shown) employs a predefined threshold to define the turn-on point of the dynamic bias controller 700. Rectifying circuit 702 rectifies those portions of the communication signal greater than the predefined threshold, low pass filter 410 filters out the AC components of the portions of the communication signal rectified by rectifying circuit 702, and the output of low pass filter 410 activates the switch 412 when portions of the rectified/filtered communication signal are present or deactivates the switch when the rectified/filtered portions of the signal are absent. Similar to the embodiment according to FIG. 5, the emitter follower transistor 416 will either activate or deactivate according to the status of switch 412.

Figure 8:
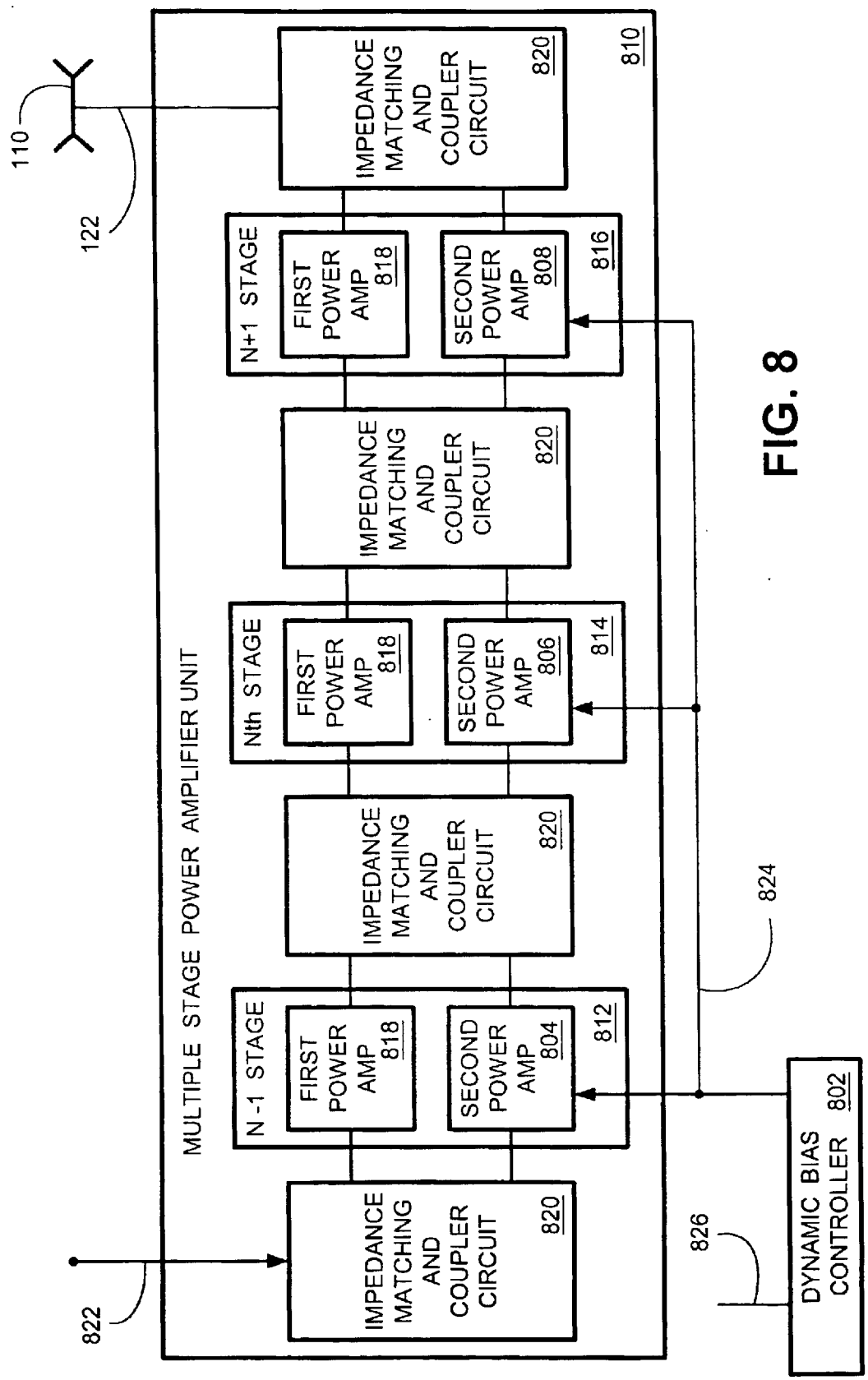
FIG. 8 is a block diagram of an embodiment of a dynamic bias controller controlling a plurality of second power amplifiers in a multiple stage power amplifier.

FIG. 8 is a block diagram of an embodiment of a dynamic bias controller 802 controlling a plurality of second power amplifiers 804, 806 and 808 residing in a multiple stage power amplifier unit 810. Multiple stage power amplifier unit 810 employs three stages; N−1 stage 812, Nth stage 814 and N+1 stage 816. A first power amplifier (amp) 818 resides in each stage 812, 814 and 816. Typically, a multiple stage power amplifier unit 810 employs a plurality of impedance matching and coupler circuits 820. The communication signal enters the multiple stage power amplifier unit 810 on connection 822 and is amplified to a desired amplified communication signal and output to antenna 110 via connection 122.

Dynamic bias controller 802 senses the communication signal on connection 826. When the amplitude of the communication signal is less than the turn-on point, the multi-stage power amplifier unit 810 amplifies the communication signal with only the plurality of first power amplifiers 818 residing in the three stages 812, 814 and 816. When the amplitude of the communication signal exceeds the turn-on point, the dynamic bias controller 802 activates each of the second power amplifiers 804, 806 and 808 via connection 824.

One skilled in the art will realize that each of the impedance matching and coupler circuits 820 of FIG. 8 are likely to have different elements residing in each circuit 820, and that FIG. 8 is intended to be a simplified illustration of the manner in that components might be coupled in a multiple stage power amplifier unit. Thus, variations in the components of a multiple stage power amplifier unit 810 employing the dynamic bias controller 802 may vary from one specific application to another without substantially affecting the operation and functionality of the dynamic bias controller 802 that is activating or deactivating the second power amplifiers 804.

The multiple stage power amplifier 810 illustrated in FIG. 8 employs three amplification stages 812, 814 and 816 for convenience of illustration purposes. The dynamic bias controller 802 could equally be applicable to a multiple stage power amplifier unit having only two amplification stages, or a multiple stage power amplifier units having more than three amplification stages. One aspect of the invention is the ability of the dynamic bias controller 802 to enable the control of a plurality of second power amplifiers based upon a single turn-on point.

For convenience of illustration, the plurality of second power amplifiers 804, 806 and 808 are shown controlled by a single connection 824. Alternatively, each of the plurality of second power amplifiers 804, 806 and 808 could be controlled over an individual connection (not shown) without departing substantially from the operation and functionality of the dynamic bias controller 802. Individual connections would be applicable if multiple stage power amplifier unit 810 employs different rated second power amplifiers (804, 806 and/or 808), each having a different turn-on signal requirement. In this situation, the dynamic bias controller 802 would have a means for providing the required unique turn-on signal to each of the second power amplifiers. For example, additional components could be added to the dynamic bias controller 802 such that the required signal is uniquely provided to each of the second power amps 804, 806 and 808 via the individual connections.

Figure 9:
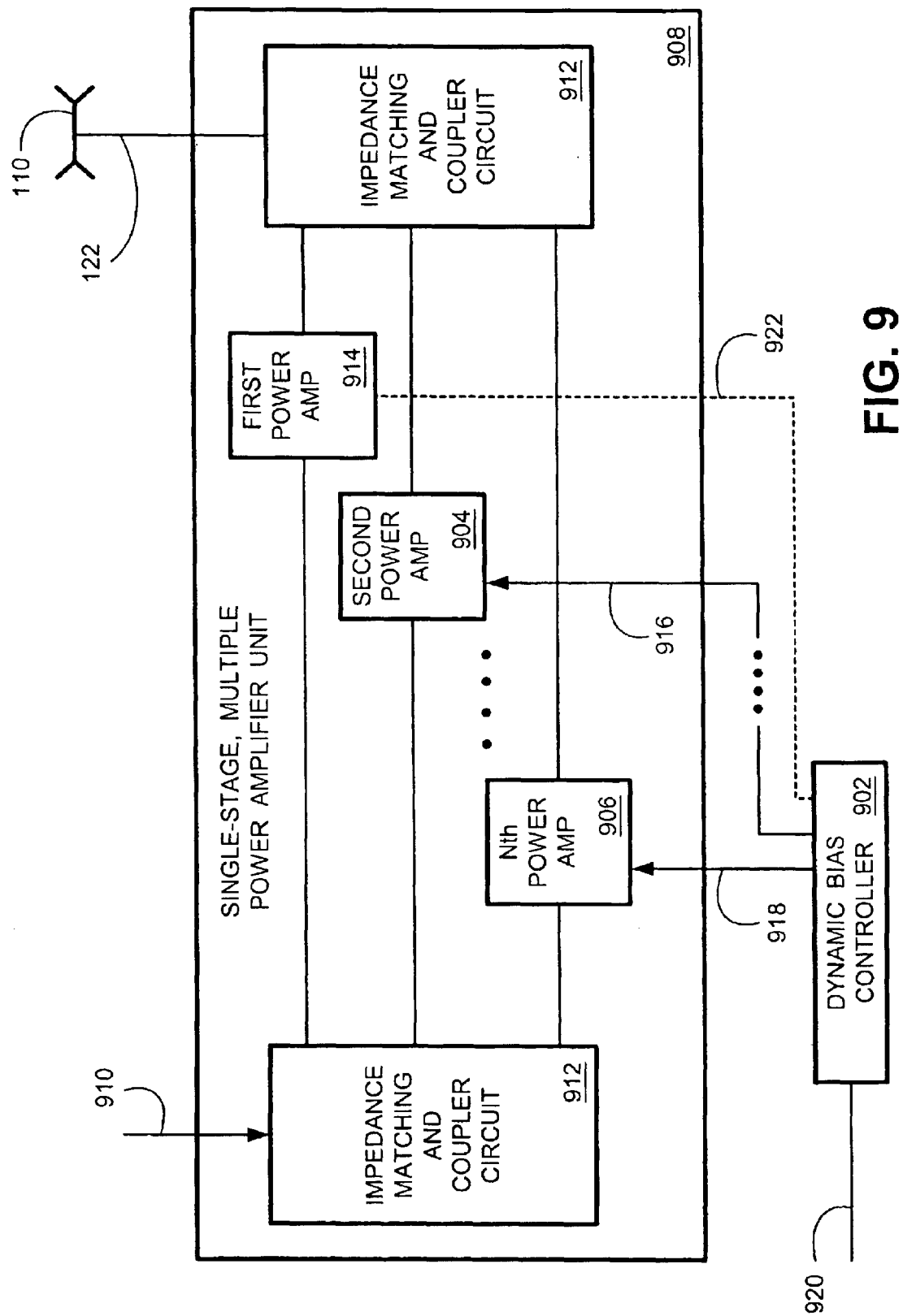
FIG. 9 is a block diagram of an embodiment of a dynamic bias controller controlling a plurality of power amplifiers residing in a single-stage, multiple power amplifier unit.

FIG. 9 is a block diagram of an embodiment of a dynamic bias controller 902 controlling a plurality of power amplifiers 904 and 906 residing in a single-stage, multiple power amplifier unit 908. With the single-stage, multiple power amplifier unit 908, a communication signal is provided on connection 910. The amplified communication signal is output to antenna 110 over connection 122. Matching impedance and coupler circuits 912 may be employed for the plurality of power amplifiers 904, 906 and 914. For convenience of illustration, the single-stage multiple power amplifier unit 910 is illustrated having three power amplifiers, a first power amplifier 914, a second power amplifier 904 and an Nth power amplifier 906. Dynamic bias controller 902 controls the second power amplifier 904 via connection 916. Dynamic bias controller 902 controls the Nth power amplifier 906 via connection 918.

The communication signal is detected by the dynamic bias controller 902 on connection 920. When the amplitude of the communication signal is below the first turn-on point, dynamic bias controller 902 deactivates the second power amplifier 904 and the Nth power amplifier 906. With this operating condition, the communication signal is amplified only by the first power amplifier 914.

When the amplitude of the communication signal exceeds a first turn-on point, the dynamic bias controller 902 activates the second power amplifier 906. The communication signal is then amplified by the first power amplifier 914 and the second power amplifier 904. (For this operating condition, it is assumed that the amplitude of the communication signal is less than a second turn-on point, as described below.)

When the amplitude of the communication signal exceeds a second turn-on point, the dynamic bias controller 902 activates the Nth power amplifier 904. Thus, the communication signal being amplified by the single-stage, multiple power amplifier unit 908, is amplified by all three power amplifiers 914, 904 and 906 during this operating condition.

Alternatively, the dynamic bias controller 902 may have deactivated the second power amplifier 904 in conjunction with the activation of the Nth power amplifier 906, assuming that the Nth power amplifier 906 was larger than the second power amplifier 904. Then, at a third turn-on point, the dynamic bias controller 902 could activate the second power amplifier 904. Furthermore, an optional connection 922 could have been provided to control the first power amplifier 914. A plurality of turn-on points could be defined within the dynamic bias controller 902 such that any one or any combination of the power amplifiers 914, 904 and 906 could be activated depending on a particular amplitude of the communication signal. Thus, a hand-held communication device (not shown) employing a single-stage, multiple power amplifier unit 908 with the dynamic bias controller 902, could be designed to operate in a highly efficient manner, thus conserving the limited power supply and optimizing operation time of the mobile communication device.

The dynamic bias controller 902 can easily be designed to control four or more such power amplifiers (not shown). However, the single-stage, multiple power amplifier unit 908 having three power amplifiers 914, 904 and 906 is used to explain the functionality and operation of the embodiment of the dynamic bias controller 902.

Yet another alternative embodiment of the dynamic bias controller may have fewer components than the dynamic bias controller 302 (FIGS. 3 and 4) or 700 (FIG. 7). For example, in some applications the emitter follower transistor 416 (FIG. 7) may be omitted. The transistor Q3 520 residing in switch 412 may be configured such that the output of switch 412 alone, over connection 432, is sufficient to control a power amplifier. Alternatively, the reference voltage circuit 704 may not be required. A suitable voltage could be provided from another component (not shown) residing in the mobile communication device 300 (FIG. 3). Another alternative embodiment of a dynamic bias controller could provide a control signal (turn-on/turn-off) to a power amplifier that already has its own controller switch. All such alternative embodiments of a dynamic bias controller are intended to be within the scope of this disclosure and be protected by the accompanying claims.

Figure 10:
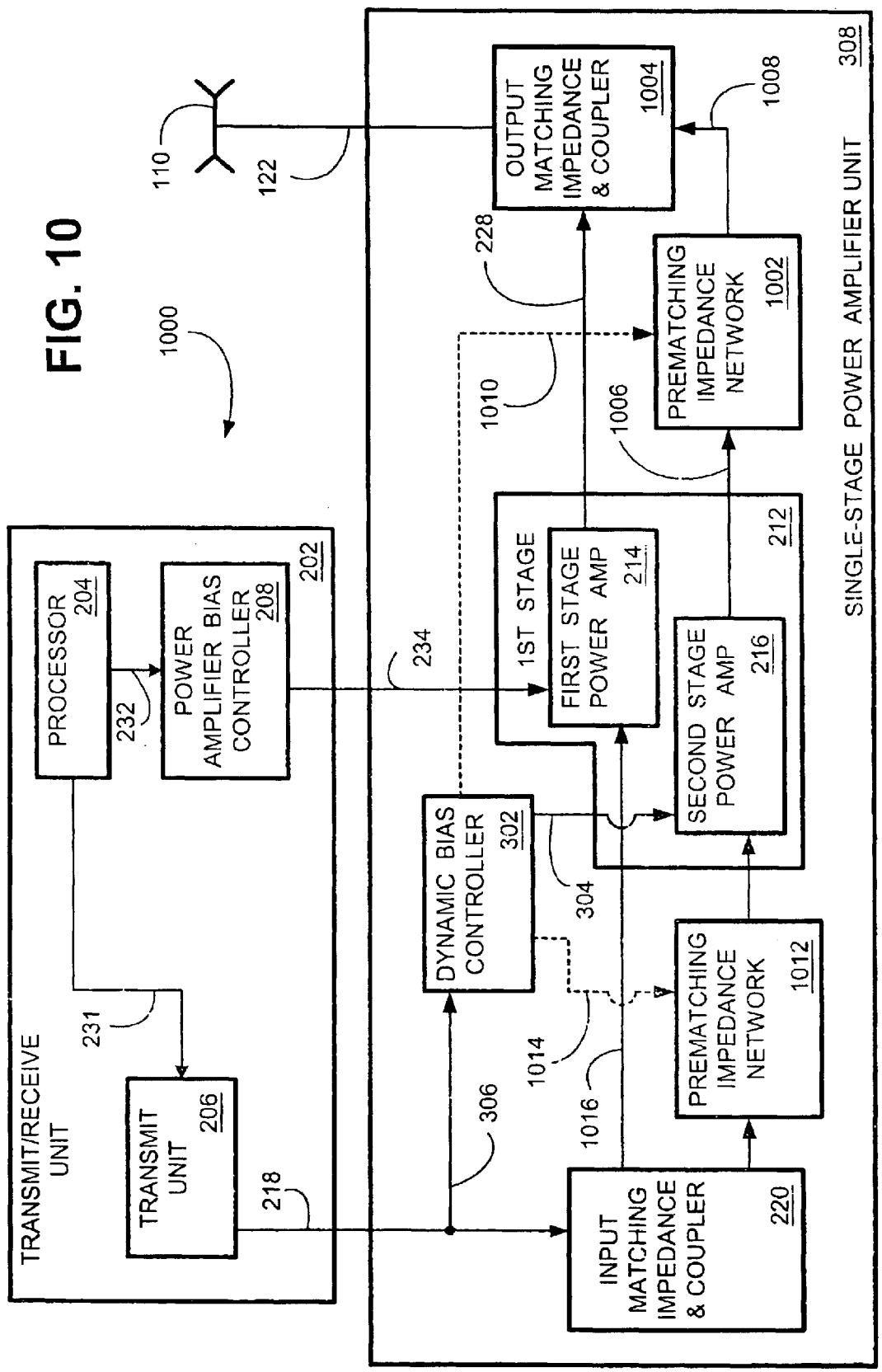
FIG. 10 is a block diagram of an embodiment of the dynamic bias controller controlling a second stage amplifier and a prematching impedance network.

Another embodiment of a dynamic bias controller system is shown in FIG. 10. FIG. 10 is a block diagram of an embodiment of the dynamic bias controller 302 controlling a second stage amplifier 216 and a prematching impedance network 1002 employed in a mobile communication device 1000. One skilled in the art will appreciate that system performance may be optimized by having an output matching impedance and coupler 1004, which is optimized for an operating condition where only the first stage power amplifier 214 is operating (second stage power amplifier 216 is off). System performance could be further optimized if the output matching impedance is modified when both the first stage power amplifier 214 and the second stage power amplifier 216 are operating.

When the second stage power amplifier 216 is controlled by the dynamic bias controller 302, a prematching impedance network 1002, coupled between the second stage power amplifier 216 and the output matching impedance and coupler 1004 (FIG. 10), can be used to modify the output impedance when both the first stage power amplifier 214 and the second stage power amplifier 216 are operating. When the dynamic bias controller 302 has deactivated the second stage power amplifier 216, the prematching impedance network 1002 does not affect the output matching impedance because no power flows from the second stage power amplifier 216, through the prematching impedance network 1002, to the output matching impedance and coupler 1004.

When the dynamic bias controller 302 has activated the second stage power amplifier 216, the prematching impedance networks 1002 and 1012 match the output matching impedance because power flows from the second stage power amplifier 216, over connection 1006, through the prematching impedance network 1002, over connection 1008, to the output matching impedance and coupler 1004.

In another embodiment, dynamic bias controller 302 may be coupled to the prematching impedance network 1002 with connection 1010. Dynamic bias controller 302 could provide an auxiliary signal, via connection 1010, to one or more switches (not shown) residing in or coupled to prematching impedance network 1002. When the dynamic bias controller 302 has deactivated the second stage power amplifier 216, the one or more switches are actuated by dynamic bias controller 302 to isolate the prematching impedance network 1002 such that the output matching impedance is not affected. When the dynamic bias controller 302 has activated the second stage power amplifier 216, the one or more switches are actuated by dynamic bias controller 302 to couple the prematching impedance network 1002 such that the output matching impedance is affected.

Prematching impedance network 1002, and any associated switches, may be implemented using well known components commonly employed in matching impedance systems and switching systems. Thus, a detailed description of the individual components residing in prematching impedance network 1002 or any associated switches are not described since such a description is not necessary to understand the operation and function of the dynamic bias controller 302. One skilled in the art will realize that the prematching impedance networks 1002 and 1012, and associated switches, may be implemented by a variety of means such that the output matching impedance is adjusted to a desired value when the dynamic bias controller 302 has activated the second stage power amplifier 216. All such embodiments of prematching impedance network 1002 utilized with a dynamic bias controller 302 are intended to be within the scope of this disclosure and to be protected by the accompanying claims.

Alternatively, the prematching impedance network 1012 could be coupled to the input of the second stage power amplifier 216 as illustrated in FIG. 10. Also, the dynamic bias controller 302 could be coupled to the prematching impedance network 1012, via connection 1014, such that switches (not shown) residing in prematching impedance network 1012 are actuated to uncouple and recouple the prematching impedance network 1012 in a manner similar to that described above for the prematching impedance network 1002.

Yet another embodiment may employ two prematching impedance networks 1002 and 1012. The prematching impedance networks 1002 and 1012 may also employ switches (not shown) controlled by the dynamic bias controller 302 as described above.

Furthermore, prematching impedance network 1002 and/or prematching impedance network 1012 may be coupled to the output and/or the input, respectively, of the first stage power amplifier 214 and controlled as described above. Prematching impedance network 1002 is coupled to the output of the first stage power amplifier 214 at a convenient location on connection 228. Similarly, prematching impedance network 1012 is coupled to the input of the first stage power amplifier 214 at a convenient location on connection 1016.

Up to four prematching impedance networks could be employed in a single-stage power amplifier unit 308. A prematching impedance network could be coupled to the input and/or the output of either, or both, the first stage power amplifier 214 and the second stage power amplifier 216. Dynamic bias controller 302 provides the appropriate control signals to the first stage power amplifier 214 and/or the second stage power amplifier 216, and to any of the prematching impedance networks employed in the single-stage power amplifier unit 308.

For convenience of explaining the operation and functionality of the various embodiments of the dynamic bias controller illustrated in FIGS. 3–10, the communication signal detected by the dynamic bias controller was illustrated and described as being received from transmit unit 206 (FIG. 3). However, the dynamic bias controller 302 (and alternative embodiments of the dynamic bias controller) operates satisfactorily when the communication signal is provided from any of the components (not shown) residing in the mobile communication device 300 (FIG. 3). The dynamic bias controller requires only that the delivered communication signal have a sufficient bandwidth as to provide meaningful detection of amplitude and a meaningful specification of the operating turn-on point(s). Depending upon the particular mobile communication device 300 in which a dynamic bias controller is installed, the dynamic bias controller has elements defined such that the delivered communication signal can be adequately detected such that the appropriate turn-on/turn-off signals can be delivered to the power amplifiers. All such variations in the source of the communication signal delivered to a dynamic bias controller and the associated components (and their elements) are intended to be within the scope of this disclosure and to be protected by the accompanying claims.

Furthermore, for convenience of illustration and the explanation of the operation and function of a dynamic bias controller, the components (attenuator 402, DC stop 406, rectifying circuit 408, low pass filer 410, switch 412, reference voltage generator 414 and the emitter follower transistor 416) are shown residing in the dynamic bias controller 302 (see FIG. 4). Alternatively, these components may reside in other convenient locations outside of the dynamic bias controller 302 without adversely affecting the operation and functionality of the dynamic bias controller 302. Also, the necessary reference voltages and supply voltages Vcc could be provided from any convenient location within the mobile communication device 300 and at any convenient value. All such alternative embodiments of the dynamic bias controller are intended to be within the scope of this disclosure and to be protected by the accompanying claims.

Figure 11:
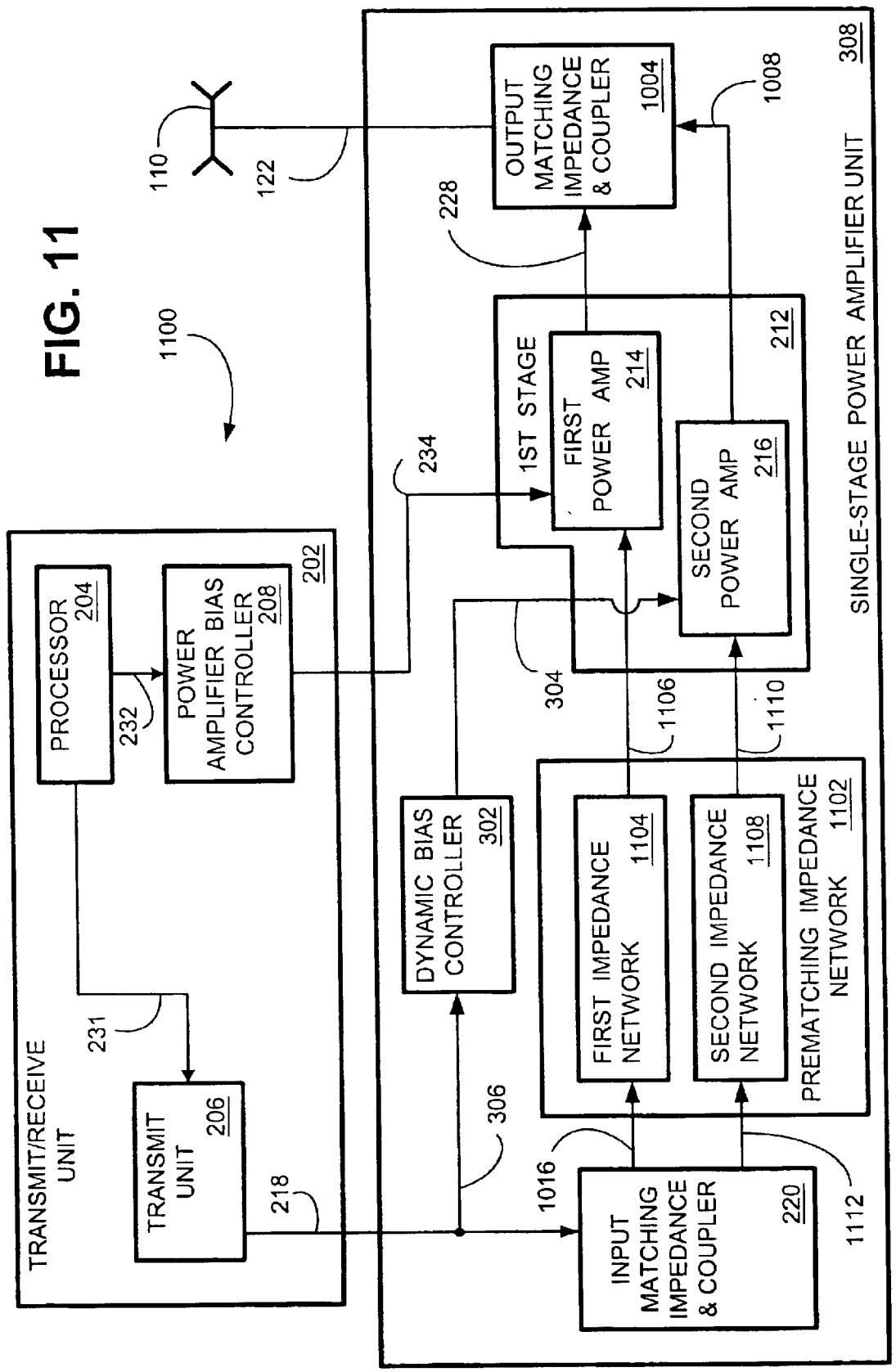
FIG. 11 is a block diagram of an embodiment of the dynamic bias controller comprising a prematching impedance network at the input of the first and second amplifiers.

FIG. 11 is a block diagram of an embodiment of the dynamic bias controller 1100 comprising a prematching impedance network 1102 with portions at the input of the first power amplifier 214 and second power amplifier 216. The prematching impedance network 1102 comprises a first impedance network 1104 coupled to the input of the first power amplifier (amp) 214, via connection 1108. The prematching impedance network 1102 further comprises a second impedance network 1108 coupled to the input of the second power amplifier 216, via connection 1110. The first impedance network 1104 and the second impedance network 1108 are coupled to the input matching impedance and coupler 220 via connections 1016 and 1112, respectively.

By design, the components (not shown) residing in the first impedance network 1104 are selected to provide a desirable net input impedance seen by the first power amplifier 214 when the second power amplifier 216 is deactivated by the dynamic bias controller 302. The components residing in the first impedance network 1104 are comprised, in one embodiment, of passive elements such as, but not limited to, resistors and/or reactances (inductors and/or capacitors). Accordingly, any desirable impedance and/or phase angle characteristics may be achieved by configuration of the components of the first impedance network 1104.

Similarly, by design, the components (not shown) residing in the second impedance network 1108 are selected to provide a desirable net input impedance seen by the second power amplifier 216 when the second power amplifier 216 is activated by the dynamic bias controller 302 and concurrently operating with the first power amplifier 214. Accordingly, the net impedance seen by the 1st stage 212 is configured at a first impedance and/or first phase angle when only the first power amplifier 214 is operating, and is configured at a second impedance and/or second phase angle when both the first power amplifier 214 and the second power amplifier 216 are operating.

The components residing in the second impedance network 1108 are comprised, in one embodiment, of passive elements such as, but not limited to, resistors and/or reactances (inductors and/or capacitors). In another embodiment, active switching elements may be included as described above. Accordingly, any desirable impedance and/or phase angle characteristics may be achieved by configuration of the components of the second impedance network 1108.

Figure 12:
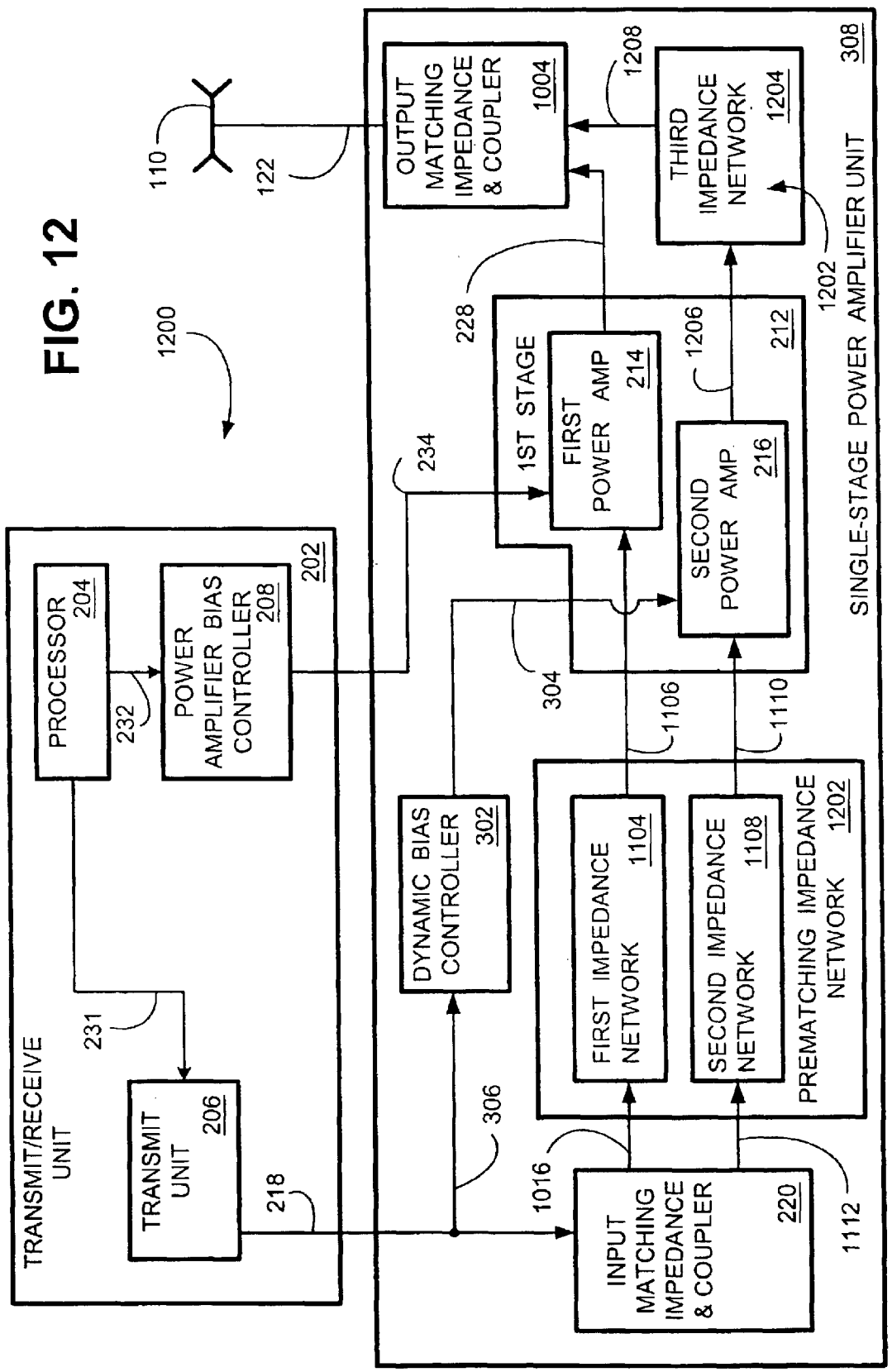
FIG. 12 is a block diagram of an embodiment of the dynamic bias controller comprising a prematching impedance network at the input of the first and second amplifiers and at the output of the second amplifier.

FIG. 12 is a block diagram of an embodiment of the dynamic bias controller 1200 comprising a prematching impedance network 1202 with portions at the input of the first power amplifier 214 and the second power amplifier 216, and another portion at the output of the second power amplifier 216. This embodiment, similar to the embodiment described above and illustrated in FIG. 11, further comprises a third impedance network 1204 coupled to the output of the second power amplifier 216, via connection 1206. The third impedance network 1204 is coupled to the output matching impedance and coupler 1004 via connection 1208.

Components (not shown) residing in the third impedance network 1204 are selected to provide a desirable net input impedance, in combination with the impedance of the second impedance network 1108, seen by the second power amplifier 216 when the second power amplifier 216 is activated by the dynamic bias controller 302 and concurrently operating with the first power amplifier 214. Accordingly, any desirable impedance and/or phase angle characteristics may be achieved by configuration of the components of the third impedance network 1204.

In an alternative embodiment, the second impedance network 1108 is omitted. Accordingly, any desirable net impedance and/or phase angle characteristics may be achieved by configuration of the components of the third impedance network 1204.

Figure 13:
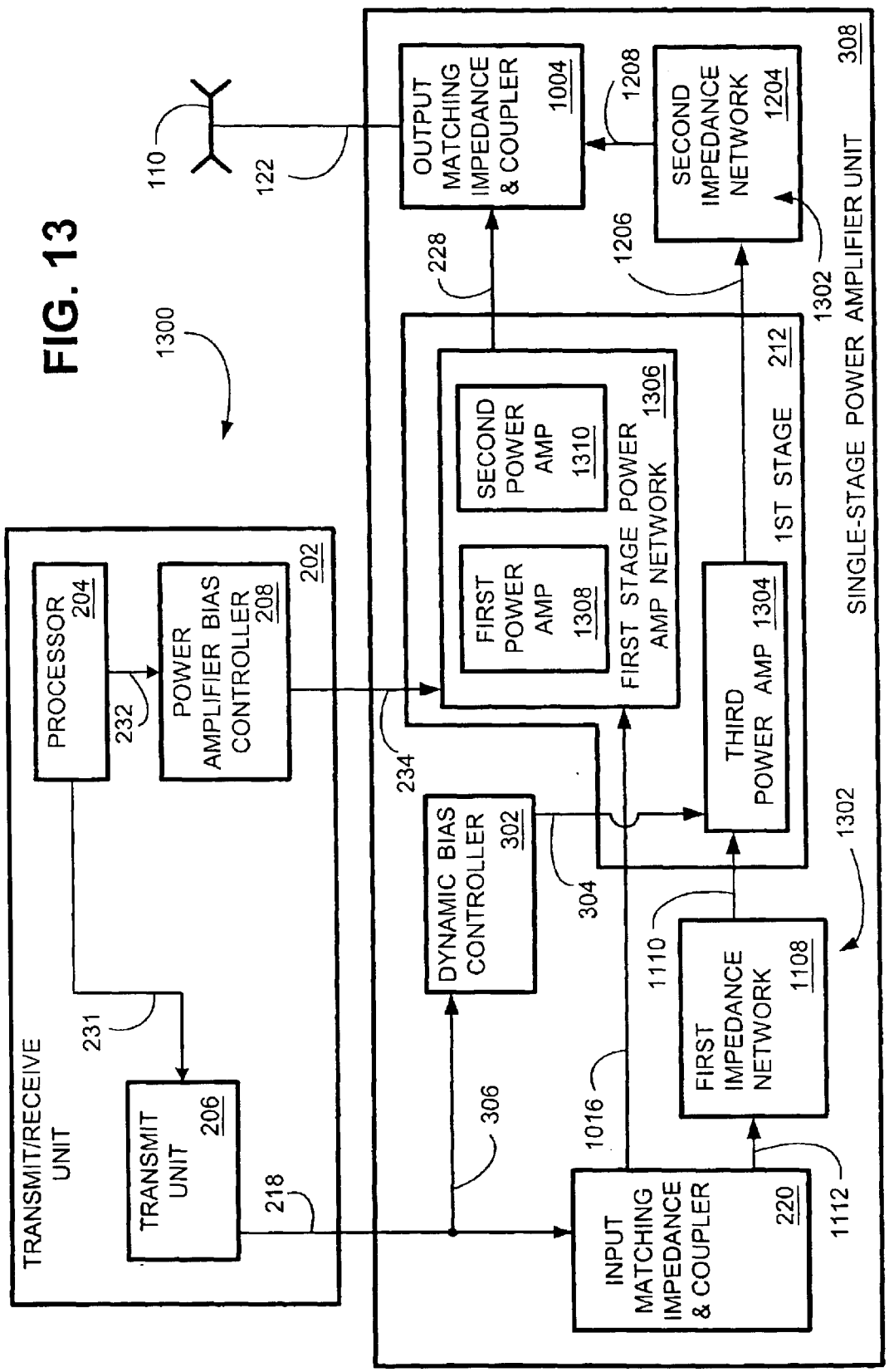
FIG. 13 is a block diagram of an embodiment of the dynamic bias controller comprising a prematching impedance network at the input and/or at the output of a third amplifier.

FIG. 13 is a block diagram of an embodiment of the dynamic bias controller 1300 comprising a prematching impedance network 1302 with portions at the input and/or at the output of the third amplifier 1304. In this embodiment, a first stage power amplifier (AMP) network 1306 comprises a plurality of serially connected amplifiers, illustrated for convenience as the first power amplifier 1308 and the second power amplifier 1310. Embodiments of the prematching impedance network 1302 comprise the above-described first impedance network 1108 and/or the second impedance network 1204. Furthermore, an input impedance (not shown) may be coupled to the input and/or output of the first stage power amplifier network 1306 to achieve desired impedance and/or phase angle characteristics.

While various embodiments of the invention have been described, it will be apparent to those of ordinary skill in the art that many more embodiments and implementations are possible that are within the scope of this invention.

What is claimed:

1. A system which adjusts impedance of a power amplifier system, comprising:

a first power amplifier amplifying a communication signal;

a bias controller for outputting a control signal, the bias controller coupled to a communication device such that the communication signal is sensed;

a second power amplifier responsive to the control signal, such that the bias controller activates the second power amplifier when an amplitude of the communication signal is at least equal to a predetermined amplitude, and such that the bias controller deactivates the second power amplifier when the amplitude of the communication signal is less than the predetermined amplitude; and a prematching impedence network coupled to at least the second power amplifier such that when the bias controller activates the second power amplifier the prematching impedance network adjusts a system impedance to a first value when the first power amplifier is activated, and such that when the bias controller deactivates the second power amplifier the prematching impedance network adjusts the system impedance to a second value when the first power amplifier and the second power amplifier are activated.

2. The system of claim 1, wherein the prematching impedance network comprises at least one reactance such that the prematching impedance network adjusts the system impedance to a first phase angle when the first power amplifier is activated, and such that the prematching impedance network adjusts the system impedance to a second phase angle when the first power amplifier and the second power amplifier are activated.

3. The system of claim 1, wherein the prematching impedance network is coupled to an input of the second power amplifier.

4. The system of claim 1, wherein the prematching impedance network is coupled to an output of the second power amplifier.

5. The system of claim 1, further comprising:
- a first portion of the prematching impedance network is coupled to an input of the first power amplifier;
- a second portion of the prematching impedance network is coupled to an input of the second power amplifier; and
- an input matching impedance and coupler coupled between a transmit unit providing the communication signal and the first portion of the prematching impedance network, and coupled between the transmit unit and the second portion of the prematching impedance network.

6. The system of claim 1, further comprising:
- a first portion of the prematching impedance network is coupled to an input of the second power amplifier;
- a second portion of the rematching impedance network is coupled to an output of the second power amplifier, and
- an input matching impedance and coupler coupled between a transmit unit providing the communication signal and the first portion of the prematching impedance network, and coupled between the transmit unit and the second portion of the prematching impedance network.

7. The system of claim 1, further comprising:
- a first portion of the prematching impedance network is coupled to an input of the first power amplifier;
- a second portion of the prematching impedance network is coupled to an input of the second power amplifier;
- a third portion of the prematching impedance network is coupled to an output of the second power amplifier, and
- an input matching impedance and coupler coupled between a transmit unit providing the communication signal and the first portion of the prematching impedance network, and coupled between the transmit unit and the second portion of the prematching impedance network.

8. A method for adjusting impedance of a power amplifier system, the method comprising the steps of:
- combining an output of a first power amplifier with an output of a second power amplifier via a coupler that couples an output connection of the first power amplifier with an output connection of the second power amplifier;
- adjusting a prematching impedance network coupled to the second power amplifier adjusts a system impedance to a first value when the second power amplifier is not actuated; and
- adjusting the prematching impedance network to a second value when the second power amplifier is actuated.

9. The method of claim 8, further comprising the steps of:
- adjusting the prematching impedance network to a first impedance when the second power amplifier is not actuated; and
- adjusting the prematching impedance network to a second impedance when the second power amplifier is actuated.

10. The method of claim 8, further comprising the steps of:
- adjusting the prematching impedance network to a first phase angle when the second power amplifier is not actuated; and
- adjusting the prematching impedance network to a second phase angle when the second power amplifier is actuated.

11. The method of claim 8, further comprising the step of coupling the prematching impedance network to an input of the second power amplifier.

12. The method of claim 8, further comprising the step of coupling the prematching impedance network to the output of the second power amplifier.

13. A system for adjusting impedance of a power amplifier system, comprising:
- means for combining output of a first power amplifier with an output of a second power amplifier via a coupler that couples an output connection of the first power amplifier with an output connection of the second power amplifier; and
- a prematching impedance network means coupled to the second power amplifier for adjusting a system impedance to a first value when the second power amplifier is not actuated, and for adjusting a system impedance to a second value when the second power amplifier is actuated.

14. The system of claim 13, wherein the prematching impedance network means is coupled to input of the second power amplifier.

15. The system of claim 13, wherein the prematching impedance network means is coupled to the output of the second power amplifier.

16. The method of claim 13, further comprising the steps of:
- means for adjusting the prematching impedance network to a first phase angle when the second power amplifier is not actuated; and
- means for adjusting the prematching impedance network to a second phase angle when the second power amplifier is actuated.

* * * * *